United States Patent [19]
Asada et al.

[11] Patent Number: 5,745,233
[45] Date of Patent: Apr. 28, 1998

[54] VOLTAGE DETECTING CIRCUIT

[75] Inventors: Katsuhiko Asada, Fukui; Atsuhiko Tamaki, Kyoto; Tadashi Morita, Suita, all of Japan

[73] Assignee: Tsubakimoto Chain Co., Osaka, Japan

[21] Appl. No.: 792,904

[22] Filed: Feb. 3, 1997

[30] Foreign Application Priority Data

Feb. 6, 1996 [JP] Japan ................................ 8-020254

[51] Int. Cl.$^6$ ............................................. G01J 1/10
[52] U.S. Cl. .......................... 356/229; 327/63; 327/514
[58] Field of Search ............................ 356/213, 226, 356/229, 218; 327/509, 514, 50, 63; 250/551, 214 R

[56] References Cited

U.S. PATENT DOCUMENTS 4,321,487  3/1982  Huykman .............................. 327/63
4,352,998  10/1982  Baker et al. ......................... 327/63

OTHER PUBLICATIONS

"Signal Converters 1991", p. 23, Published by Yokogawa Electronics Co., Ltd.
"1991 Products Data Book" pp. 3–11, Published by Burr–Brown Japan. Ltd.

Primary Examiner—Hao Q. Pham
Attorney, Agent, or Firm—Darby & Darby

[57] ABSTRACT

A voltage detecting circuit is capable of detecting the voltage to be detected at high precision, is small in size, and is low in manufacturing cost. A first photo coupler and a second photo coupler are interposed between voltage input terminals to which the voltage to be detected is applied. The photo coupler has light emitting elements connected parallel reversely, first voltage generator for generating a voltage depending on the photo detector side currents of the first photo coupler and second photo coupler, a differential amplifier whose one input terminal receives the voltage generated by the first voltage generator. A third photo coupler and a fourth photo coupler having light emitting elements are connected parallel reversely for receiving the output current of the differential amplifier, and a second voltage generator for generating a voltage corresponding to the photo detector side currents of the third photo coupler and fourth photo coupler. The voltage generated by the second voltage generator is fed into the other input terminal of the differential amplifier, so that the voltage depending on the light emitting element side currents of the third photo coupler and fourth photo coupler is matched with the voltage fed into the voltage input terminals.

4 Claims, 6 Drawing Sheets

VOLTAGE DETECTING CIRCUIT

BACKGROUND OF THE INVENTION

The present invention relates to a voltage detecting circuit for detecting the voltage to be detected.

An alternating-current voltage to be supplied to a motor to be driven contains noise components such as high voltage pulses generated in various electric appliances connected to power supply cables connected to an alternating-current power source, and the alternating-current voltage is high. Accordingly, when detecting such alternating-current voltage, electronic components incorporated in the voltage detecting circuit for detecting alternating-current voltage must be electrically insulated in order to protect from noise components and high voltage, and it is also necessary to apply to the voltage detecting circuit after stepping down to a low voltage.

Generally, therefore, a power transformer (PT) capable of insulating the alternating-current voltage to be detected and stepping down the voltage is widely used. Voltage detecting circuits using such a transformer are mentioned in page 23 of a catalog of "Signal Converters 1991" published by Yokogawa Electronics Co., Ltd.

However, when detecting the voltage by using the transformer, since the transformer is composed of coil and iron core, manufacturing and handling are easy and the cost is low, but the leak inductance is too large to be ignored, and thereby a phase error is caused in a low frequency region of frequency of the alternating-current voltage to be detected of 20 Hz or less. Besides, at direct-current voltage or in a frequency region of several hertz, since the magnetic flux changes hardly, a voltage corresponding to the alternating-current voltage to be detected cannot be obtained accurately. Therefore, when the power source frequency range is wide in the case of, for example, servo motor or inverter, the alternating-current voltage supplied thereto cannot be detected at high precision. Moreover, since its outer size and weight are large, it is hard to reduce the size and weight of the voltage detecting circuit.

Alternatively, a voltage detecting circuit for detecting the voltage to be detected while insulating electrically by photo coupling is used. FIG. 1 is a circuit diagram of a voltage detecting circuit using a photo coupler. A voltage input terminal $T_a$ of voltage input terminals $T_a$ and $T_b$ to which alternating-current voltage to be detected is applied is connected to the anode of a photo diode PD of a photo coupler PC composed of the photo diode PD and a photo transistor PT through a resistance 1, and the cathode of the photo diode PD is connected to the voltage input terminal $T_b$. The collector of the photo transistor PT for receiving the light emitted by the photo diodes PD is connected to a direct-current power source DCV, and its emitter is connected to one terminal of a variable resistor VR through a temperature compensation circuit 2, and the other terminal is grounded GND. The resistance variable terminal of the variable resistor VR is connected to a voltage output terminal $T_c$.

In this voltage detecting circuit, when an alternating-current is applied between voltage input terminals $T_a$ and $T_b$, and a positive voltage of the alternating-current voltage is applied to the voltage input terminal $T_a$, a half-wave positive current I flows into the photo diode PD through the resistance 1, and the photo diode PD emits light. This light is received by the photo transistor PT, and a positive current i depending on the positive current I flows in the variable resistor VR from the direct-current power source DCV through the photo transistor PT and the temperature compensation circuit 2. So that a positive voltage depending on the positive current i is generated in the variable resistor VR, and is delivered to the voltage output terminal $T_c$.

In this way, a voltage obtained by detecting the alternating-current voltage to be detected is obtained at the voltage output terminal $T_c$. However, sine the photo coupler PC is used, the alternating-current voltage cannot be detected directly. Therefore, when applying a bias voltage and detecting the alternating-current voltage, since there is almost no inductance in the photo coupler PC and its related circuits, the phase error of alternating-current voltage is not generated. Also, the voltage to be detected in a wide frequency range from direct-current voltage to several kilohertz can be detected by stepping down to low voltage.

As shown in FIG. 1, when detecting the voltage by using one photo coupler, since the general photo coupler is a semiconductor largely changeable in the current transmission ratio $h_{FE}$ depending on changes of ambient temperature or passing current, an expensive photo coupler excellent in temperature characteristic and current transmission characteristic must be used, which adds to the cost of the voltage detecting circuit. Besides, since the emitting element side voltage of the photo coupler cannot be estimated from the detecting element side voltage thereof, temperature compensation circuit for compensating the temperature characteristic of the current transmission ratio of photo coupler must be used, which also adds to the cost.

Furthermore, using two photo couplers, a voltage detecting circuit for detecting the voltage to be detected by insulating electrically is disclosed, for example, in FIG. 1 of "1991 Products Data Book" (page 3–11) published by BURR-BROWN JAPAN, LTD.

FIG. 2 is a circuit diagram of the voltage detecting circuit. One voltage input terminal $T_a$ of voltage input terminals $T_a$ and $T_b$ to which alternating-current voltage AC to be detected is applied is connected to a negative input terminal − of an operational amplifier A1 and the anode of a receptor diode D1. The output terminal $A1_c$ of the operational amplifier A1 is connected to the anode of a photo diode PD. The positive input terminal + of the operational amplifier A1 is connected to the cathode of the receptor diode D1 and the other voltage input terminal $T_b$. The cathode of the photo diode PD is connected to the grounding terminal $T_e$.

Both the voltage input terminal $T_b$ and grounding terminal $T_e$ are grounded. The anode of a receptor diode D2 is connected to a direct-current power source E and a negative input terminal − of an amplifier A2. The output terminal of the amplifier A2 is connected to one voltage output terminal $T_c$. The cathode of the receptor diode D2 is connected to a positive input terminal + of the amplifier A2 and the other voltage output terminal $T_d$, and is grounded. The photo diode PD is disposed so that the light emitted from the photo diode PD may enter the receptor diodes D1 and D2 at equal quantity of light.

In this voltage detecting circuit, a current equal to the current flowing into the receptor diode D1 by the light emitted from the photo diode PD flows into the receptor diode D2, and the voltage corresponding to the current of the receptor diode D2 is outputted from the amplifier A2. Accordingly, without having effects of temperature characteristic of the photo coupler composed of the photo diode PD and the receptor diodes D1 and D2, the alternating-current voltage AC to be detected applied between the input terminals $T_a$ and $T_b$ can be detected by insulating with the photo coupler, on the basis of the output voltage of the amplifier A2 varying depending on the current flowing in the voltage input terminal $T_a$.

When detecting the voltage by using the two photo couplers as shown in FIG. 2, it is necessary to match exactly the distances of the receptor diodes and the photo diode in order to receive the light from the photo diode equally. Thus, it requires time and labor for positioning and the manufacturing cost is increased. Besides, alternating-current voltage cannot be entered directly, and it is necessary to feed by applying bias voltage, among other problems. Further, it is required to supply power from a separated power source such as a DC—DC convertor, so as to operate the amplifier A1 on input side.

BRIEF SUMMARY OF THE INVENTION

The invention has been devised to solve the above problems, and it is hence a primary object of the invention to provide a voltage detecting circuit capable of detecting the voltage to be detected at high precision and of adjusting easily, which is small in size and low in manufacturing cost with no use of a separated power source.

The voltage detecting circuit of the invention comprises a first photo coupler and a second photo coupler interposed between voltage input terminals to which the voltage to be detected is applied, having light emitting elements thereof connected parallel reversely, first voltage generating means for generating a voltage depending on the photo detector side currents of the first photo coupler and second photo coupler, a differential amplifier whose one input terminal receives the voltage generated by the first voltage generating means, a third photo coupler and a fourth photo coupler having light emitting elements connected parallel reversely for receiving the output current of the differential amplifier, and second voltage generating means for generating a voltage corresponding to the photo detector side currents of the third photo coupler and fourth photo coupler, wherein the voltage generated by the second voltage generating means is fed into the other input terminal of the differential amplifier, and the voltage depending on the light emitting element side currents of the third photo coupler and fourth photo coupler is matched with the voltage fed into the voltage input terminal.

In the invention, when the voltage to be detected is fed into the voltage input terminal, a current depending on the voltage and its polarity flows into the light emitting element of the first photo coupler or the light emitting element of the second photo coupler. A current depending on the current of the light emitting element of the first photo coupler flows in the photo detector thereof, a current depending on the current of the light emitting elements of the second photo coupler flows in the photo detector thereof, and these currents flow into the first voltage generating means, whereby a voltage relating to the voltage fed into the voltage input terminals is generated at the first voltage generating means. When the voltage generated in the first voltage generating means is put into one input terminal of the differential amplifier, the differential amplifier outputs a voltage depending on the voltage applied to into one input terminal, and a current depending on the voltage and its polarity flows into the light emitting element of the third photo coupler or the light emitting element of the fourth photo coupler.

A current depending on its current transmission ratio and light emitting element side current flows in the photo detector of the third photo coupler, a current depending on its current transmission ratio and light emitting element side current flows in the photo detector of the fourth photo coupler, and these currents flow into the second voltage generating means, whereby a voltage relating to the voltage fed into one input terminal of the differential amplifier is generated at the second voltage generating means. When the voltage generated at the second voltage generating means is put into the other input terminal of the differential amplifier, the differential amplifier amplifies the voltage of difference between the voltage put into the other input terminal and the voltage put into the one input terminal. Then a current depending on the voltage amplified and outputted by the differential amplifier and its polarity flows into the light emitting element of the third photo coupler or fourth photo coupler, and a current compensated for the current transmission ratio of the third photo coupler and fourth photo coupler flows into the light emitting elements of the third photo coupler and fourth photo coupler.

Accordingly, by nearly equalizing the current transmission ratio in the first photo coupler, second photo coupler, third photo coupler, and fourth photo coupler, and setting in same temperature condition, the voltage depending on the photo detector side currents of the first photo coupler and second photo coupler can be compensated at the current transmission ratios of the third photo coupler and fourth photo coupler same as the current transmission ratio of the first photo coupler and second photo coupler. As a result, the voltage depending on the light emitting element side currents of the third photo coupler and fourth photo coupler is matched with the voltage put into the voltage input terminal.

Accordingly, the input voltage to be detected can be detected at high precision by using photo couplers.

The above and further objects and features of the invention will more fully be apparent from the following detailed description with the accompanying drawings.

DETAILED DESCRIPTION OF THE INVENTION

Referring now to a drawing, an embodiment of the invention is described in detail below.

Figure 1:
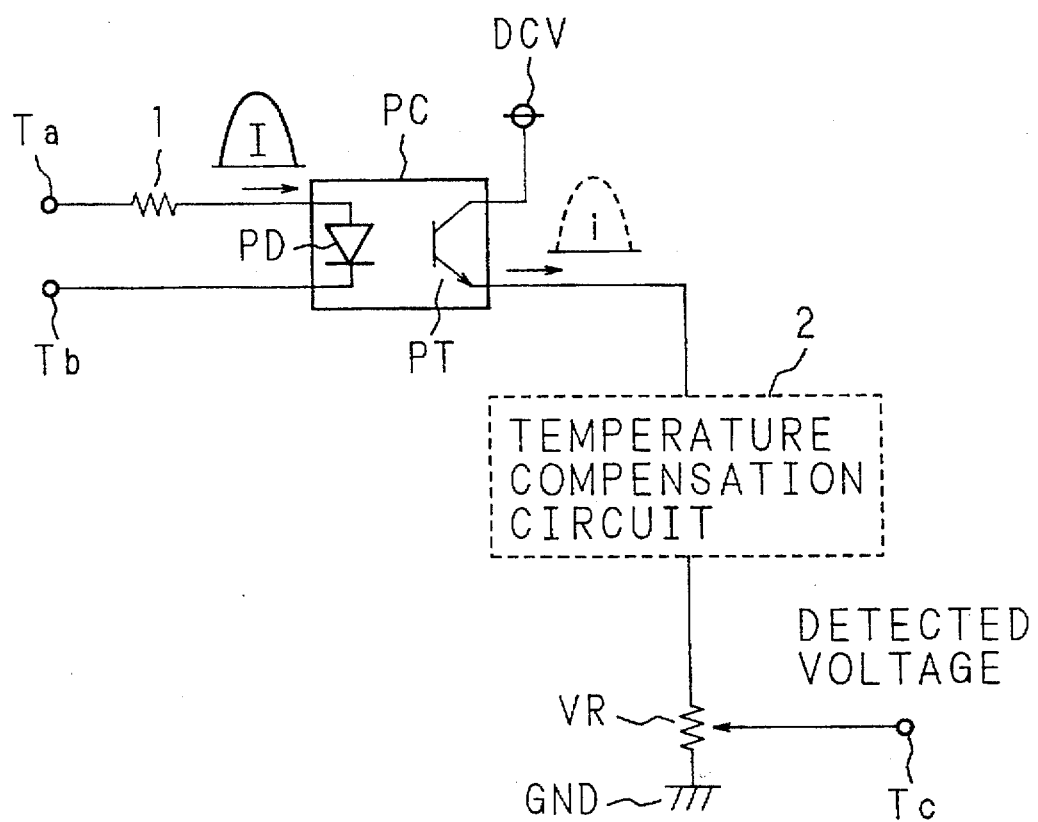
FIG. 1 is a circuit diagram of a conventional voltage detecting circuit.
Figure 2:
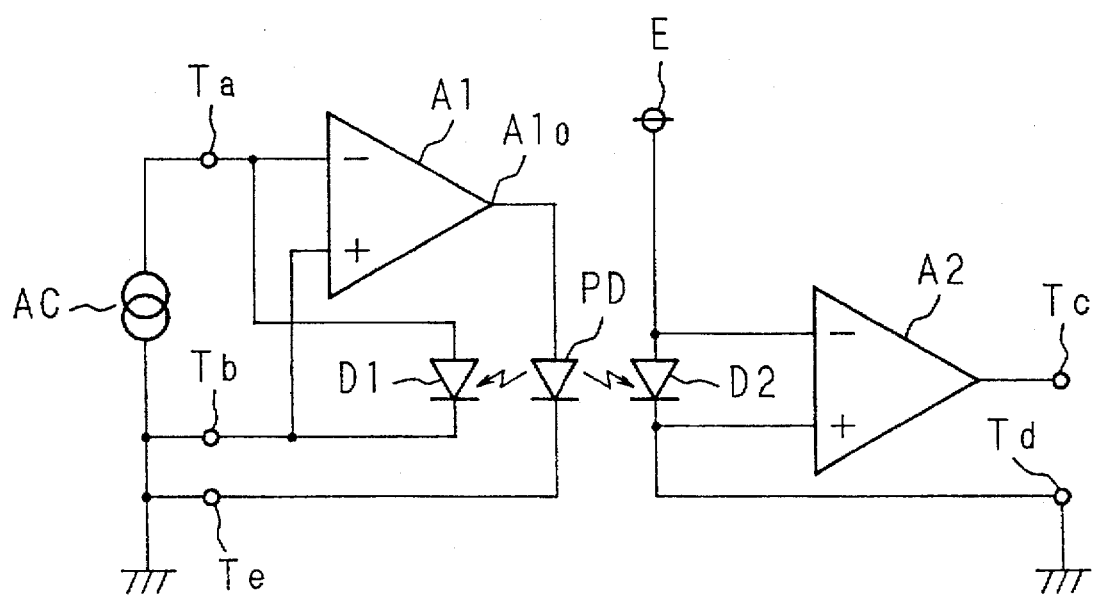
FIG. 2 is a circuit diagram of another conventional voltage detecting circuit.
Figure 3:
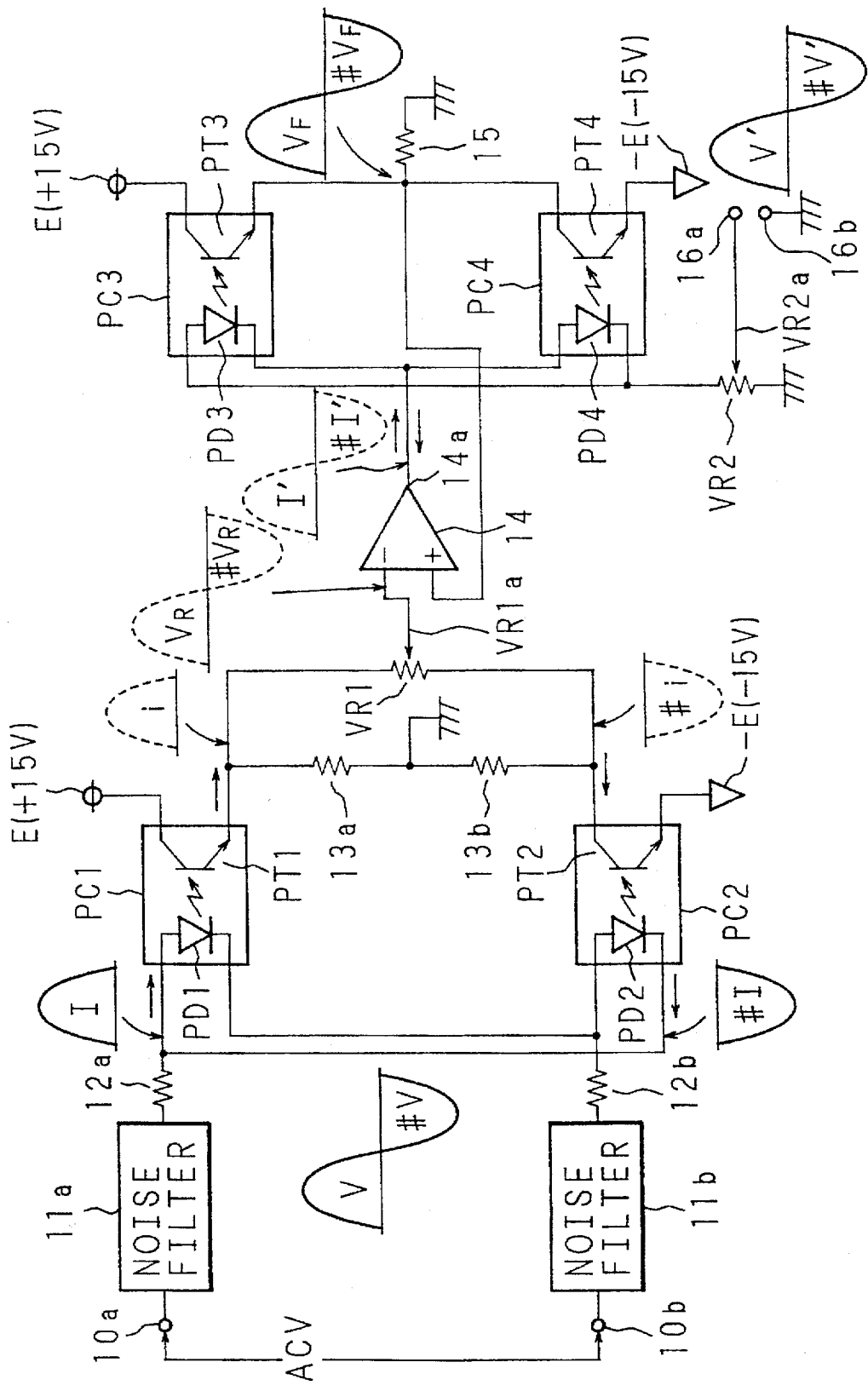
FIG. 3 is a circuit diagram showing a constitution of a voltage detecting circuit according to the invention.

FIG. 3 is a circuit diagram showing a constitution of a voltage detecting circuit according to the invention. One voltage input terminal 10a to which a voltage to be detected is applied is connected to the anode of a photo diode PD1 which is a light emitting element of a photo coupler PC1 and the cathode of a photo diode PD2 which is a light emitting element of a photo coupler PC2, through a series circuit of a noise filter 11a and a resistance 12a which is a voltage drop element.

The other voltage input terminal 10b is connected to the anode of the photo diode PD2 of the photo coupler PC2 and the cathode of the photo diode PD1 through a series circuit of a noise filter 11b and a resistance 12b which is a voltage drop element. The collector of a photo transistor PT1 which is a photo detector of the photo coupler PC1 is connected to a direct-current power source E of voltage+15 V. The emitter of the photo transistor PT1 is connected to the collector of a photo transistor PT2 which is a photo detector of the photo coupler PC2 through a series circuit of a resistance 13a and a resistance 13b. The emitter of the photo transistor PT2 is connected to a direct-current power source −E of voltage −15 V. The connection intermediate point of the resistance 13a and resistance 13b is grounded. With the series circuit of resistances 13a and 13b, a variable resistor VR1 for offsetting the output voltage of a differential amplifier 14 described below is connected parallel. The variable resistor VR1 absorbs difference between current transmission characteristics of the four photo couplers to equal the detected voltages of positive and negative of alternative inputs.

A resistance varying terminal VR1a of the variable resistor VR1 is connected to a negative input terminal − of the differential amplifier 14. An output terminal 14a of the differential amplifier 14 is connected to the cathode of a photo diode PD3 which is a light emitting element of a photo coupler PC3 and the anode of a photo diode PD4 which is a light emitting element of a photo coupler PC4. The anode of the photo diode PD3 and the cathode of the photo diode PD4 are connected, and grounded through a variable resistor VR2. This variable resistor VR2 may be replaced by a simple resistance. A resistance varying terminal VR2a of the variable resistor VR2 is connected to one voltage output terminal 16a. The other voltage output terminal 16b is grounded.

The collector of a photo transistor PT3 which is a photo detector of the photo coupler PC3 is connected to the direct-current power source E of voltage +15 V. The emitter of the photo transistor PT3 is connected to the collector of a photo transistor PT4 which is a photo detector of the photo coupler PC4, and its emitter is connected to the direct-current power source −E of voltage −15 V. The connection intermediate point of the emitter of the photo transistor PT3 and the collector of the photo transistor PT4 is connected to a positive input terminal + of the differential amplifier 14, and is grounded through a resistance 15. The current transmission ratios of the photo couplers PC1, PC2, PC3 and PC4 are selected nearly at same value.

The operation of thus constituted voltage detecting circuit is described below.

When an alternating-current voltage ACV to be detected is entered between the voltage input terminals 10a and 10b, the noise component superposed on the alternating-current voltage ACV is removed by the noise filters 11a, 11b, and the alternating-current voltage ACV minus noise components is stepped down by the resistances 12a and 12b to be a low voltage, which is applied to the photo diodes PD1 and PD2 of the photo couplers PC1 and PC2.

Currents I and #I limited by the resistances 12a and 12b and depending on positive and negative side voltages V and #V of the alternating-current voltage ACV flow from the voltage input terminals 10a and 10b into the photo diodes PD1 and PD2, so that the photo diodes PD1 and PD2 emit light alternately. The light emitted by the photo diodes PD1 and PD2 is received by the photo transistors PT1 and PT2, and the photo transistors PT1 and PT2 are turned on alternately. Then currents i and #i flow from the direct-current power sources E, −E to the resistances 13a and 13b through the photo transistors PT1 and PT2, and a positive side voltage VR and a negative side voltage #$V_R$ depending on the currents i and #i are generated at the resistance varying terminal VR1a of the variable resistor VR1.

That is, the positive side voltage $V_R$ and negative side voltage #$V_R$ of the alternating-current voltage depending on the alternating-current voltage ACV to be detected are generated. Incidentally, the currents i and #i flowing in the photo transistor PT1 and PT2 vary as the current transmission ratios of the photo couplers PC1 and PC2 are changed by the ambient temperature, and the currents i and #i are not matched with the currents I and #I of the photo diodes PD1 and PD2. Therefore the voltage depending on the currents of the photo transistors PT1 and PT2 and the alternating-current voltage ACV fed between the voltage input terminals 10a and 10b are not matched.

However, when voltages VR and #VR of the resistance varying terminal VR1a are put into the negative input terminal − of the differential amplifier 14, the differential amplifier 14 outputs a voltage depending on the voltage fed to the negative input terminal −, and currents I' and #I' depending on the voltages $V_R$ and #$V_R$ flow into the variable resistor VR2 through the photo diodes PD3 and PD4 of the photo couplers PC3 and PC4. The photo diodes PD3 and PD4 emit light alternately depending on the currents I' and #I', and thereby the photo transistors PT3 and PT4 are turned on alternately. Thus, a current flows into the resistor 15 from the direct-current power sources E and −E through the photo transistors PT3 and PT4, and the terminal voltage of the resistance 15 becomes positive side voltage $V_F$ and negative side voltage #$V_F$ depending on the output currents I' and #I' of the differential amplifier 14, whereby these voltages $V_F$ and #$V_F$ are put into the positive input terminal + of the differential amplifier 14.

Consequently, the differential amplifier 14 amplifies the voltage of the difference between the voltage fed into the positive input terminal + and the voltage fed into the negative input terminal −, and depending on the voltage outputted by the differential amplifier 14, the current compensated for the current transmission ratios of the photo couplers PC3 and PC4 flows into the variable resistor VR2 through the photo diodes PD3 and PD4 of the photo couplers PC3 and PC4. As a result, a voltage depending on the current obtained by compensating the current transmission ratios of the photo couplers PC3 and PC4 is generated in the variable resistor VR2.

Therefore, by selecting the current transmission ratios of the photo couplers PC1, PC2, PC3 and PC4 nearly at same value, the currents flowing in the photo diodes PD3 and PD4 of the photo couplers PC3 and PC4 are matched with the currents compensated for the current transmission ratios of the photo couplers PC1 and PC2, and it is the same as when the currents compensated for the current transmission ratios of the photo couplers PC1 and PC2 flow in the variable resistor VR2. Therefore the voltage generated in the variable resistor VR2 is matched with the voltage ACV to be detected fed between the voltage input terminals 10a and 10b. In this way, the voltages V' and #V' generated in the resistance varying terminal VR2a of the variable resistance VR2 are outputted between the voltage output terminals 16a and 16b, so that the alternating-current voltage ACV to be detected can be detected on the basis of the voltage outputted between the voltage output terminals 16a and 16b.

Meanwhile, by adjusting the position of the resistance varying terminal VR2a of the variable resistor VR2, the magnitude of the voltage outputted between the voltage output terminals 16a and 16b can be adjusted. Thus, the voltage ACV to be detected can be detected at high precision without being influenced by the current transmission ratios of the photo couplers PC1, PC2, PC3 and PC4.

Thus, by using the photo couplers PC1, PC2, PC3 and PC4 of same current transmission ratio and disposing in same temperature conditions, the current compensated for the current transmission ratios of the photo couplers PC1 and PC2 is obtained, and the alternating-current voltage to be detected can be detected at high precision. Besides, since inductance component is not contained in the voltage detecting circuit, a phase error of alternating-current voltage is not caused. Moreover, since transformer is not used, it may be composed in small size and light weight.

Figure 4:
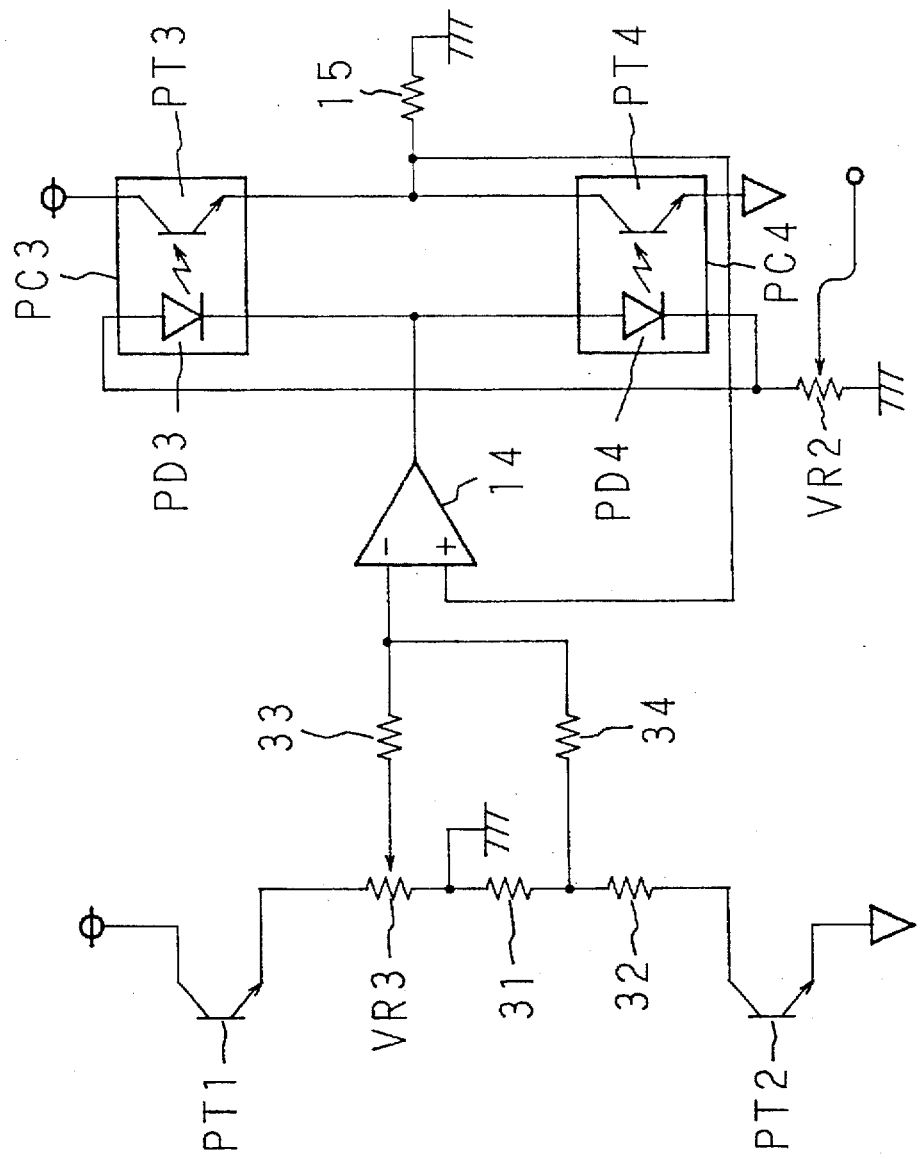
FIG. 4 is a circuit diagram showing another constitution of a main portion of a voltage detecting circuit according to the invention.

The variable resistor VR1 can be replaced by a construction shown in FIG. 4. In FIG. 4, a variable resistor VR3 and resistances 31 and 32 are connected between the photo transistors PT1 and PT2, in series. A resistance varying terminal of the variable resistor VR3 is connected to the negative input terminal − of the differential amplifier 14 through a resistance 33. The connecting point of the resistances 31 and 32 is also connected to the negative input terminal − through a resistance 34.

Figure 5:
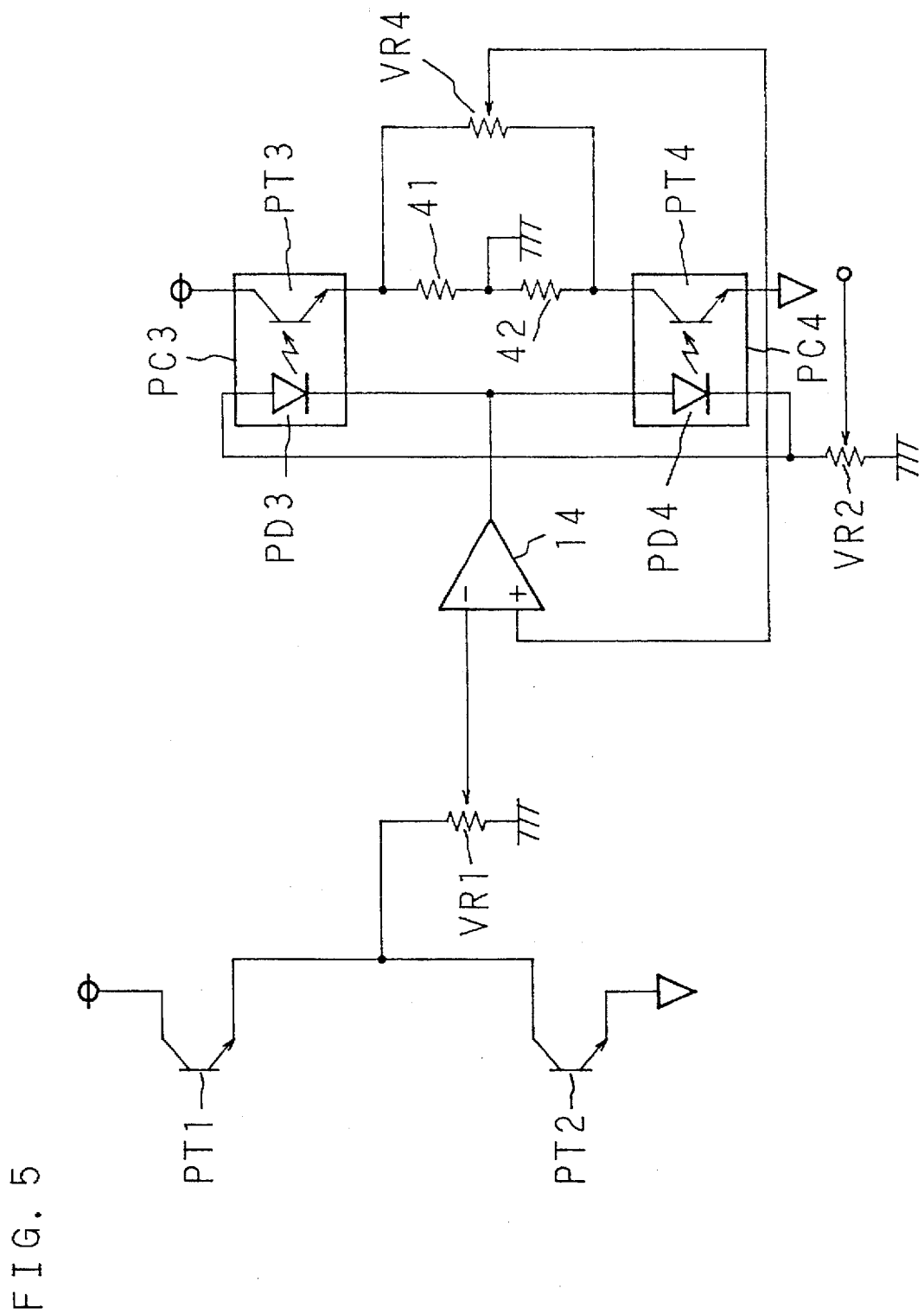
FIG. 5 is a circuit diagram showing another constitution of a main portion of a voltage detecting circuit according to the invention.

FIG. 5 shows an embodiment wherein difference of the current transmission characteristics can be eliminated on output side. Resistances 41 and 42 are connected between the photo transistors PT3 and PT4 in series, and a variable resistor VR4 is connected to the series circuit in parallel. The connecting point of the resistances 41 and 42 is grounded. The resistance varying terminal of the variable resistor VR4 is connected to the positive input terminal + of the amplifier 14.

Figure 6:
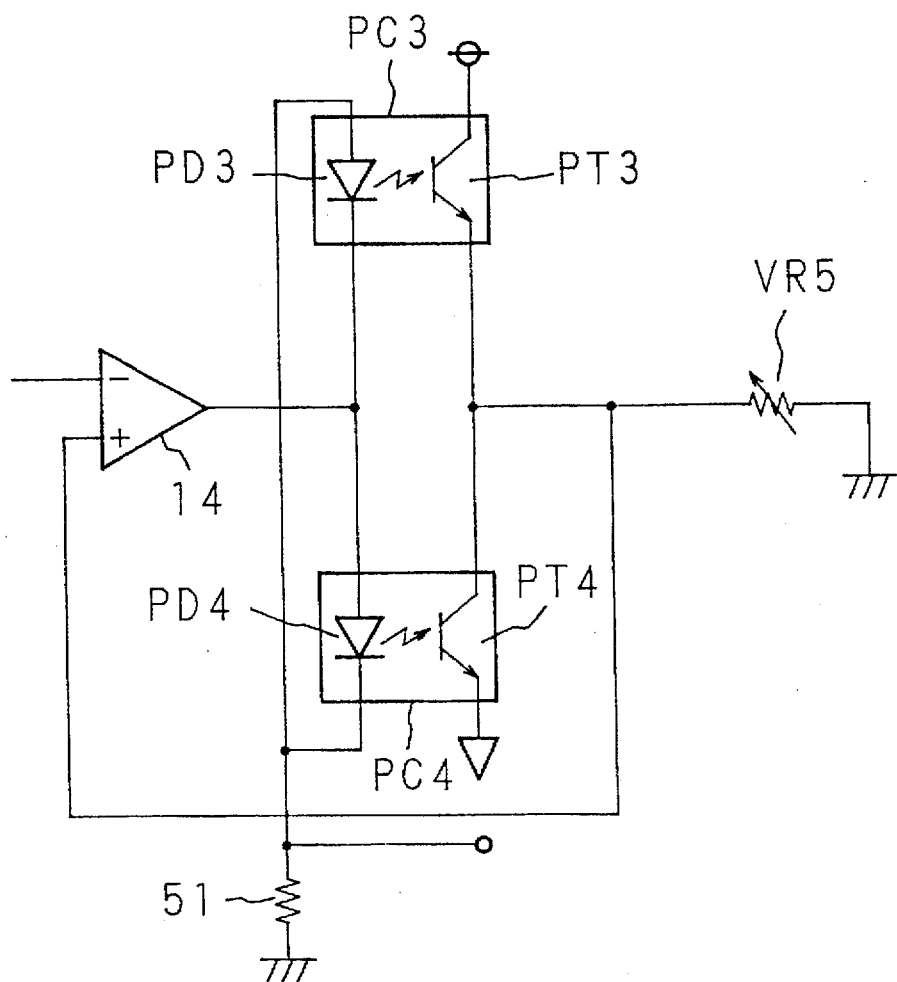
FIG. 6 is a circuit diagram showing another constitution of a main portion of a voltage detecting circuit according to the invention.

In FIG. 6, the connecting point of the photo transistors PT3 and PT4 is grounded through a variable resistor VR5, and also connected to the positive input terminal + of the amplifier 14. The anode of the photo diodes PD3 and the cathode of the photo diode PD4 are connected, and grounded through a resistance 51. This construction makes it possible to adjust gain by setting the value of the variable resistor VR5 at a desirable value.

In the foregoing embodiment of the invention, the voltage to be detected is an alternating-current voltage, but a direct-current voltage can be similarly detected.

According to the invention, as mentioned herein, since the effects of temperature characteristic of the current transmission ratio is eliminated by using two sets of photo couplers, the voltage to be detected can be detected at high precision without causing a phase error in a wide frequency range. Besides, since the photo couplers for electrically insulating the voltage to be detected may be those nearly same in the current transmission ratio, it is not necessary to use expensive ones extremely excellent in the temperature characteristic of current transmission ratio, so that the cost may be reduced. Therefore, the invention brings about an excellent effect of providing a voltage detecting circuit capable of detecting the voltage at high precision, and being small in size, light in weight, and low in manufacturing cost.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

We claim:

1. A voltage detecting circuit comprising:
    a first photo coupler and a second photo coupler interposed between voltage input terminals to which the voltage to be detected is applied, each having a light emitting element connected parallel reversely and a photo detector;
    first voltage generating means for generating a voltage depending on the photo detector side currents of said first photo coupler and second photo coupler;
    a differential amplifier whose one input terminal receives the voltage generated by said first voltage generating means;
    a third photo coupler and a fourth photo coupler each having a light emitting element connected parallel reversely for receiving the output currents of said differential amplifier and a photo detector; and
    second voltage generating means for generating a voltage corresponding to the photo detector side currents of said third photo coupler and fourth photo coupler,
    wherein the voltage generated by said second voltage-generating means is fed into the other input terminal of said differential amplifier,
    so that the voltage depending on the light emitting element side currents of said third photo coupler and fourth photo coupler is matched with the voltage fed into said voltage input terminal.

2. A voltage detecting circuit of claim 1, wherein said first voltage generating means includes resistances connected in series in which the photo detector side currents of said first photo coupler and second photo coupler flow, and a variable resistor connected parallel to these resistances.

3. A voltage detecting circuit of claim 1, wherein said second voltage generating means includes a variable resistor connected to the light emitting elements of said third photo coupler and fourth photo coupler.

4. A voltage detecting circuit of claim 2, wherein said second voltage generating means includes a variable resistor connected to the light emitting elements of said third photo coupler and fourth photo coupler.

* * * * *